United States Patent [19]

Goldie

[11] Patent Number: 4,864,241
[45] Date of Patent: Sep. 5, 1989

[54] LONG TIME CONSTANT EDDY CURRENT COMPENSATION

[75] Inventor: Frederick T. D. Goldie, London, England

[73] Assignee: Picker, Limited, Middlesex, United Kingdom

[21] Appl. No.: 201,626

[22] Filed: Jun. 2, 1988

[30] Foreign Application Priority Data

Aug. 17, 1987 [GB] United Kingdom ................ 8719396

[51] Int. Cl.[4] ............................................. G01R 33/20
[52] U.S. Cl. ..................................... 324/318; 324/320
[58] Field of Search ............... 324/202, 225, 233, 310, 324/313, 318, 319, 320, 322, 307

[56] References Cited

U.S. PATENT DOCUMENTS 4,326,166  4/1982  Pigeon et al. ..................... 324/233
4,761,614  8/1988  Prammer et al. .................. 324/320

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

Magnetic coils (12) create a generally uniform magnetic field through an examination region (10). A radio frequency transmitter applied RF pulses to an RF antenna (26). A gradient field controller (30) generates gradient excitation current pulse profiles which pass through an eddy current calibration circuit (50) to gradient coils (38). A radio frequency receiver (92) receives magnetic resonance signals from the examination region, which signals are Fourier transformed (94) into an image representation (96). The eddy current calibration circuit (50) modifies the current pulse profiles in order to compensate for eddy currents, i.e. to remove the effect of eddy currents such that the resultant gradient magnetic field has a selected profile. An automatic calibration circuit (60) adjusts the decay constant or center frequency of a band pass filter (56) and the gain of an amplifier (58). A sine wave generator (62) applies a sine wave voltage to the gradient coils as a search coil monitors (64) the resultant magnetic field and a current probe (70) monitors the current flowing through the gradient coil. The magnetic field and current are phase sensitively detected (66, 72) to determine the relative amplitude and phase of each. The relative amplitude and phase are compared as the frequency of the sine wave signal is swept. The time constant or center frequency of the band pass circuit is set to the frequency (78) at which the field phase lags the current phase by a maximum and the gain is set in accordance with a fractional fall-off (f) in the relative amplitude.

16 Claims, 3 Drawing Sheets

LONG TIME CONSTANT EDDY CURRENT COMPENSATION

BACKGROUND OF THE INVENTION

The present invention relates to the art of electromagnetic field correction and modification. It finds particular application in conjunction with the maintenance of gradient magnetic field spatial linearity in magnetic resonance imaging and will be described with particular reference thereto. It is to be appreciated, however, that the invention will also find application in conjunction with magnetic resonance spectroscopy and other applications in which electromagnetic field linearity is adjusted or controlled.

In magnetic resonance imaging and spectroscopy, a uniform magnetic field is created through an examination region in which a subject to be examined is disposed. The magnetic field through the examination region preferentially aligns the magnetization of the dipoles of the subject with the uniform field. Radio frequency excitation pulses are applied to cause the magnetization to precess about the uniform magnetic field. After the radio frequency excitation, radio frequency magnetic resonance signals are generated as the precessing magnetization decays back toward alignment with the uniform magnetic field. The frequency of the radio frequency magnetic resonance signals is proportional to the strength of the magnetic field and the gyromagnetic ratio of the precessing dipole. Various combination of radio frequency pulses and magnetic field gradient pulses are applied to manipulate the precessing magnetization to create echo signals and the like.

In magnetic resonance imaging, gradient magnetic fields are applied to select and encode subregions in the subject. Some magnetic field gradients are applied to select one or more slices or planes to be imaged. Other magnetic field gradients selectively modify the uniform field to encode positionally related information into the frequency and phase of the magnetic resonance signals.

The gradient fields are conventionally applied as a series of gradient pulses. The duration and timing of the pulses relative to the radio frequency signals is precisely timed to optimize performance. More specifically, electric current pulses of the selected duration, amplitude, shape, and timing are applied to gradient field coils to cause corresponding gradient magnetic field pulses.

One of the problems is that the resultant gradient magnetic field pulses do not match the profile of the electric current pulses applied to the gradient field coils. A changing magnetic field inherently induces eddy currents, which eddy currents cause corresponding eddy magnetic fields. Thus, each applied current pulse causes a gradient magnetic field pulse which causes eddy currents that add unwanted eddy components to the induced gradient magnetic field pulse. The eddy current effect varies with the amount and conductivity of the material in which the eddy currents are induced, the proximity of this material to the gradient field coil, and the magnitude of the pulsed gradient magnetic field. The conductive structures might include supporting structures for the magnets, a liquid nitrogen dewar of a superconducting magnet, control panels, room structures, and other adjacent metallic or conductive structures. The variances in the thickness, concentricity, and other construction tolerances, from magnet to magnet, cause each magnetic resonance system to generate spatially variant eddy currents with different magnitudes and time constants.

In order to improve the imaging quality, the shape of the electric current pulse is altered such that the magnetic field produced by the sum of the altered current pulse and the eddy currents more closely matches the desired gradient magnetic field pulse shape and duration. One such correction circuit is illustrated in U.S. Pat. No. 4,703,275, issued Oct. 27, 1987 to G. Neil Holland. In this patent, the current pulse is divided among a plurality of parallel connected correction paths. Each correction path includes a band pass filter which has an adjustable centre frequency and a variable gain amplifier. More specifically, the band pass filter includes an RC circuit whose time constant is adjustable to adjust the effective centre frequency of the filter. By appropriately adjusting the RC time constant or frequency of the band pass filter and the gain of the amplifier, appropriate compensation can be made for a corresponding eddy current. The output of the parallel correction paths are summed to produce the modified gradient current pulse.

To calibrate the frequency and amplitude adjustment of each of the current adjustment paths heretofore, a search coil was disposed in the magnetic field and connected by an integrater to one channel of a dual channel oscilloscope. The summed output of the correction channels was connected to the second channel of the oscilloscope. The RC time constant of frequency and the gain of each correction path were adjusted until the gradient of the selected wave form was produced.

This calibration method was effective for high and middle frequency eddy currents, i.e. those with relatively short decay constants. However, this method tends to be difficult and less accurate for low frequency eddy currents, i.e. those with long decay times. Although this method works well for decay times in the millisecond range, it becomes significantly less effective as the decay times approach the tenths of a second and seconds range.

The present invention provides a new and improved technique for calibrating eddy current compensation circuitry that is particularly effective for low frequency eddy currents.

SUMMARY OF THE INVENTION

In accordance with one aspect of the present invention, a method of calibrating an eddy current correction circuit for a gradient coil is provided. The correction circuit has at least a time constant or centre frequency adjustment and a gain adjustment. An oscillating electrical signal is applied to the coil while a resultant magnetic field is monitored. The frequency of the applied signal is swept as the monitoring continues. A frequency is determined at which at least one of the amplitude and phase of the monitored field changes relatively to the amplitude or phase of the applied signal. The centre frequency is set to match the determined frequency.

In accordance with a more limited aspect of the invention, a determination is made of the extent to which a ratio of the amplitude of the applied signal and monitored field changes about the determined frequency. The gain adjustment is set in accordance with the amplitude ratio change.

In accordance with another aspect of the present invention, an apparatus for calibrating the correction circuit is provided. An oscillator applies an oscillating voltage signal to the gradient coil through the calibration circuit. A search coil monitors the amplitude and phase of a resultant magnetic field. A first phase sensitive detector connected with the search coil produces first frequencey and phase signals. A current probe monitors current flow through the gradient coil. A second phase sensitive detector produces second frequency and phase signals indicative of the amplitude and phase of the coil current. A comparing means compares the first and second amplitude and phase signals. A maximum phase lag means determines the frequency at which the phase of the magnetic field lags the current phase by a maximum. A time constant adjusting means adjusts the centre frequency of the band pass filter in such a manner that the filter creates a phase lead reaching a maximum at the minimum phase lag frequency.

In accordance with a more limited aspect of the present invention, an amplitude change determining means determines a change in the ratio of the first and second amplitudes adjacent the phase lag frequency and a gain adjusting means adjusts the gain in accordance therewith.

A primary advantage of the present invention resides in its fast, accurate adjustment of eddy current compensation circuitry.

Another advantge of the present invention is that it readily identifies the centre frequency or time constant for eddy currents with long decay constants.

Another advantage of the present invention is that it facilitates direct setting of the eddy current correction gain.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting the invention.

DETAILED DESCRIPTION OF THE PREFERRED EMBODIMENTS

Figure 1:
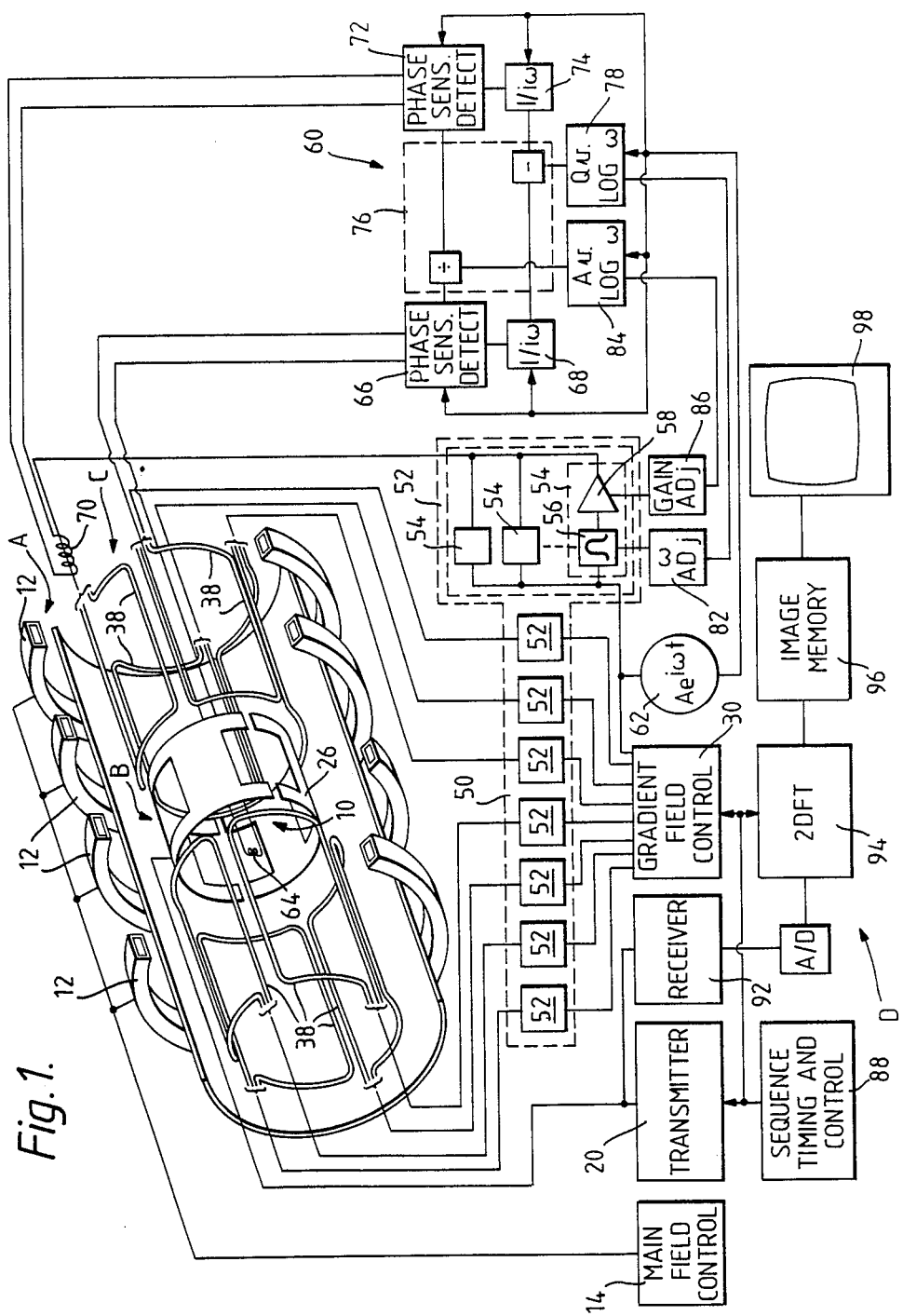
FIG. 1 is a diagrammatic illustration of a magnetic resonance imaging apparatus including an eddy current circuit and automatic calibration means therefor.

With reference to FIG. 1, a magnetic resonance imaging apparatus includes a main magnetic field means A for generating a substantially uniform magnetic field longitudinally through an examination or image region 10. The main magnetic field means includes a plurality of main field magnets 12 which are operated under the control of a main field control means and power supply 14. Various electrical and mechanical shimming techniques are provided for correcting or removing any non-linearity or non-uniformity in the main magnetic field through the image region such as may be caused by the surrounding imager hardware or other adjacent ferromagnetic structues.

Figure 2:
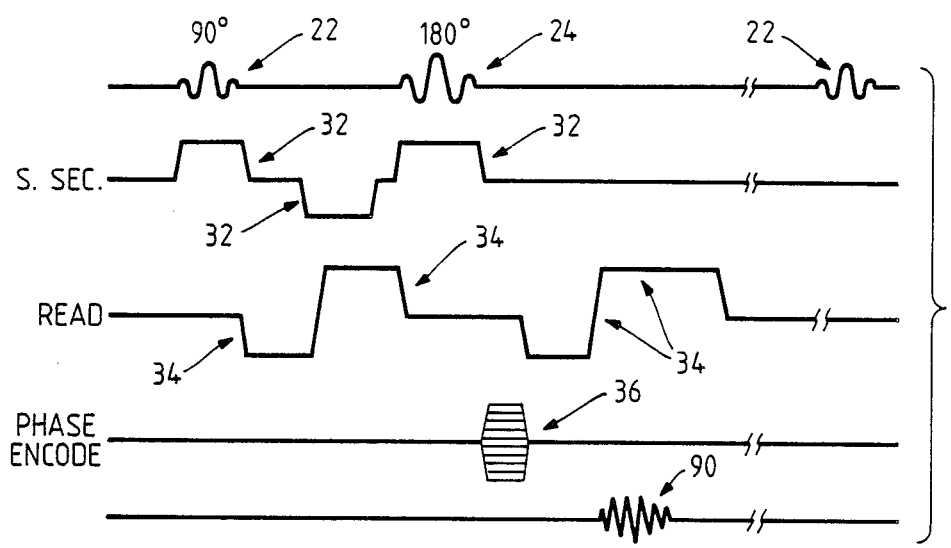
FIG. 2 is a graphic depiction of a typical spin echo imagery sequence.

With primary reference to FIG. 1 and secondary reference to FIG. 2, a resonance excitation means B includes a radio frequency transmitter 20 for generating a magnetic resonance excitation pulse 22 and other magnetic resonance manipulation pulses 24. A radio frequency antenna 26 is disposed adjacent the image region for transmitting the radio frequency pulses to the patient or other subject in the image region.

A gradient field means C selectively applies gradient magnetic fields across the main magnetic field in the image region. A gradient field control means 30 selectively generates gradient field energizing current pulse profiles with a preselected timing and duration relative to the radio frequency pulses 22 and 24. Commonly, the gradient energization profiles includes slice select gradient profiles 32, for selecting a slice or planar region to be imaged. A read gradient profile 34 provides frequency encoding along a preselected read axis lying within the selected slice. With each repetition of the sequence, a phase encode gradient profil 36 of a different amplitude provides a phase encoding along a phase encode axis, commonly perpendicular to the read axis.

The gradient energizing profiles, preferably current pulses, are generated in the gradient field controller 30 and applied to a plurality of gradient coils 38. The gradient coils convert the current pulses into corresponding gradient magnetic field profiles. However, changing magnetic fields such as the gradient magnetic field profiles, induce eddy currents in the surrounding conductive structures. The eddy currents generate additional magnetic field components that oppose the gradient magnetic field profiles but decay with time. In this manner, the eddy currents distort the gradient magnetic field profile such that it differs from the preselected profile.

With continuing reference to FIG. 1, a gradient profile calibration or correction means 50 alters the gradient energization profiles to compensate for eddy currents. Like, individual pre-emphasis correction circuits 52 are provided for each gradient coil. Each pre-emphasis correction circuit alters the received gradient energization profile, e.g. a trapezoidal current pulse, such that when the resultant magnetic field gradient is summed with the induced eddy current field, the preselected gradient magnetic field profile is achieved.

As indicated above, each eddy current generates a magnetic field with a centre frequency and a strength which are determined from the characteristics of the structure in which the eddy current is induced. Because the eddy current opposes the gradient magnetic field, each eddy current effective subtracts a magnetic field component of the eddy current centre frequency from the resultant magnetic field. To remove the effects of the eddy current, each calibration circuit includes a series of parallel connected calibration paths 54. Each calibration path includes a middle frequency range selecting means 56, e.g. a bandpass filter, and an amplifier 58. Each of the band pass filters is adjusted in accordance with the centre frequency or time constant of one of the eddy currents. The time constant is the inverse of the centre frequency. The gain of the amplifier 58 is adjusted in accordance with the strength of the corresponding eddy current. An individual calibration path 54 is provided for each eddy current for which compensation is made.

An automatic calibration means 60 identifies the centre frequency of selected eddy currents and determines their strength. For a sinusoidal input current, i.e. an input current of the form:

$$I_{in} = A e^{i\omega t} \tag{1},$$

the net gradient field response at a given location may be described:

$$B \propto A\left(1 - \frac{\lambda f i_\omega t}{1 + i\omega t}\right) e^{i\omega t}. \tag{2}$$

At low frequencies, i.e. as the frequency approaches zero, the eddy current induced magnetic field response may be approximated as:

$$B_{\omega \to 0} \propto A e^{i\omega t} \tag{3}.$$

At high freqencies, the eddy current field response can be approximated as:

$$B_{\omega t >> 1} \propto A(1-f) e^{i\omega t} \tag{4},$$

where the frequency f is a fractional fall off in amplitude between high and lo frequencies. The time constant can be identified from the turn over in the gradient frequency response. The phase of response has a minimum when:

$$\omega = \frac{1}{t\sqrt{1-f}} \tag{5}$$

The automatic calibration means 60 adjusts the time constant or centre frequency and the gain from these parameters.

The automatic calibration means 60 includes a sine wave generator 62 which generates an oscillating input signal of the form of Equation (1). This sinusoidal input signal is applied through the profile calibration or correction means 50 to the gradient coils. A search coil 64 is placed in the image region to monitor the induced magnetic fields. The search coil is connected with a first quadrature phase sensitive detector 66 and a multiplying means 68 which multiplies the phase sensitively detected voltage by $1/i\omega$ to provide signals indicative of the amplitude and the phase of the generated field relative to the oscillating input voltage.

The current actually flowing in the gradient coils is detected with an inductive coil probe 70. A second phase sensitive detector 72 and a multiplying means 74 provide signals indicative of the amplitude and phase of the current relative to the oscillating input voltage. A comparing means 76 divides the complex numbers from the first and second phase sensitive detectors, i.e. divides the modulus and subtracts the phase. More specifically, the sensed current and magnetic field amplitudes are divided and the second current and magnetic field phases are subtracted to isolate the frequency dependence of the gradient field, generated as a function of the input current.

Figure 3:
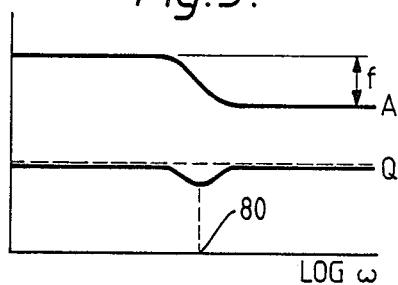
FIG. 3 is a graphical representation of a characteristic amplitude and phase ratio shift as a function of frequency.

With continuing reference to FIG. 1 and further reference to FIG. 3, a maximum phase lag determining means 78 determines a frequency 80 at which the phase lag of the magnetic field reaches a maximum relative to the phase of the current as the sine wave source 62 is swept through a range of frequencies surrounding an anticipated eddy current centre frequency. As illustrated in FIG. 3, the maximum phase leg frequency may be determined by plotting the log of the frequency against the phase ratio to find the minimum. A centre frequency adjusting means 80 adjusts the centre frequency or time constant of a selected one of the calibration paths in accordance with the maximum phase lag frequency.

There is a systematic difference between the filter circuit centre frequency and the frequency at which the phase plot has a minimum. This difference increases as the degree of eddy current coupling or fractional fall-off increases. The pre-emphasis correction circuit 52 is adjusted in such a manner that the frequency response has a plot with a peak equal and opposite to the phase minimum of the gradient's base frequency response. The shape of the phase curve and the position of the peak is a function of the gain and the centre frequency. The exact relationship for a given apparatus may be determined experimentally by iterative adjustment and measurement.

A gradient field strength determining means 84 determines a relative strength of the induced eddy current. More specifically to the preferred embodiment, the eddy current strength determining means determines the fractional fall-off by plotting the log of the frequency vs. the the ratio of the amplitudes determined by the first and second phase sensitive detectors. An amplitude adjusting means 86 adjusts the gain of the amplifier 58 in accordance with the measured fractional fall-off. The greater the fractional fall-off, the higher the gain which is selected. Although the fractional fall-off and gain are generally proportional, their exact relationship may vary with the physical equipment selected. Accordingly, it is preferable that the amplitude adjustment means 86 be selected to be functional with the physical equipment selected.

In the preferred calibration procedure, the low frequency, long time constant calibration paths or circuits 54 are adjusted first. Second, the high frequency, short time constant calibration paths or circuits are calibrated in accordance with the prior art. For example, the described above, the output from the sensing probe and the input current may be connected to a dual input oscilloscope and the time constant and gain adjusted until substantial conformity is achieved.

Thereafter, the gradient field controller 30, the radio frequency transmitter 20, under the control of a central sequence timing and control computer 88 initiate a conventional imaging sequence. A radio frequency receiver 92 receives magnetic resonance signals 90. An image reconstruction means D reconstructs an image from the received resonance signals. The magnetic resonance signals are digitzed and processed by an inverse Fourier transform means 94 to reconstruct a digital image representation. The digital image representation is stored in an image memory 96. The image may be displayed on a video monitor 98, subject to further processing, stored on tape or disk, or the like.

Figure 4:
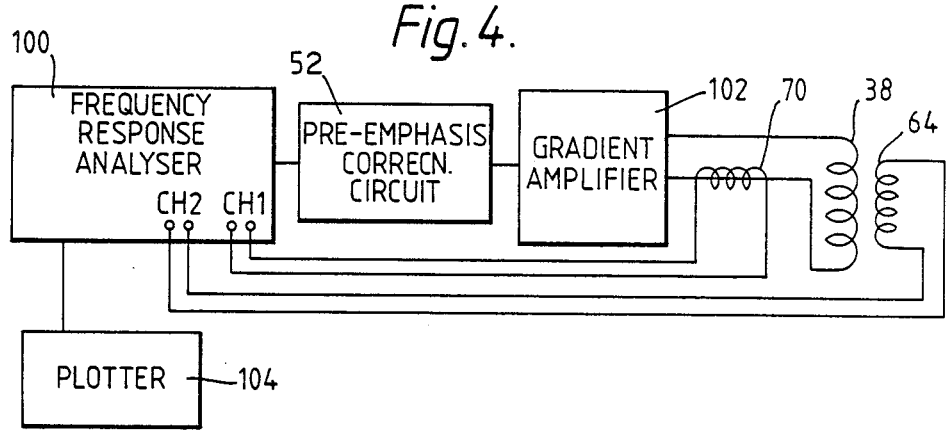
FIG. 4 is another embodiment of the calibration circuitry.

With reference to FIG. 4, the invention may be implemented manually as well. The search coil 64 and the current probe 70 are connected with the two channels of a conventional frequency response analyzer 100. The analyser applies an oscillating signal with each of a plurality of pre-selected frequencies through a pre-emphasis correction circuit 52 and a gradient amplifier 102 to the gradient coil 38. A graphic plotter 104 under the control of the analyzer provides a man-readable plot of the amplitude shift vs. the log of the frequency and another man-readable plot of the phase shift vs. the log of the frequency, analogous to FIG. 3. The pre-emphasis correction circuit is adjusted in accordance with the plots.

Figure 5:
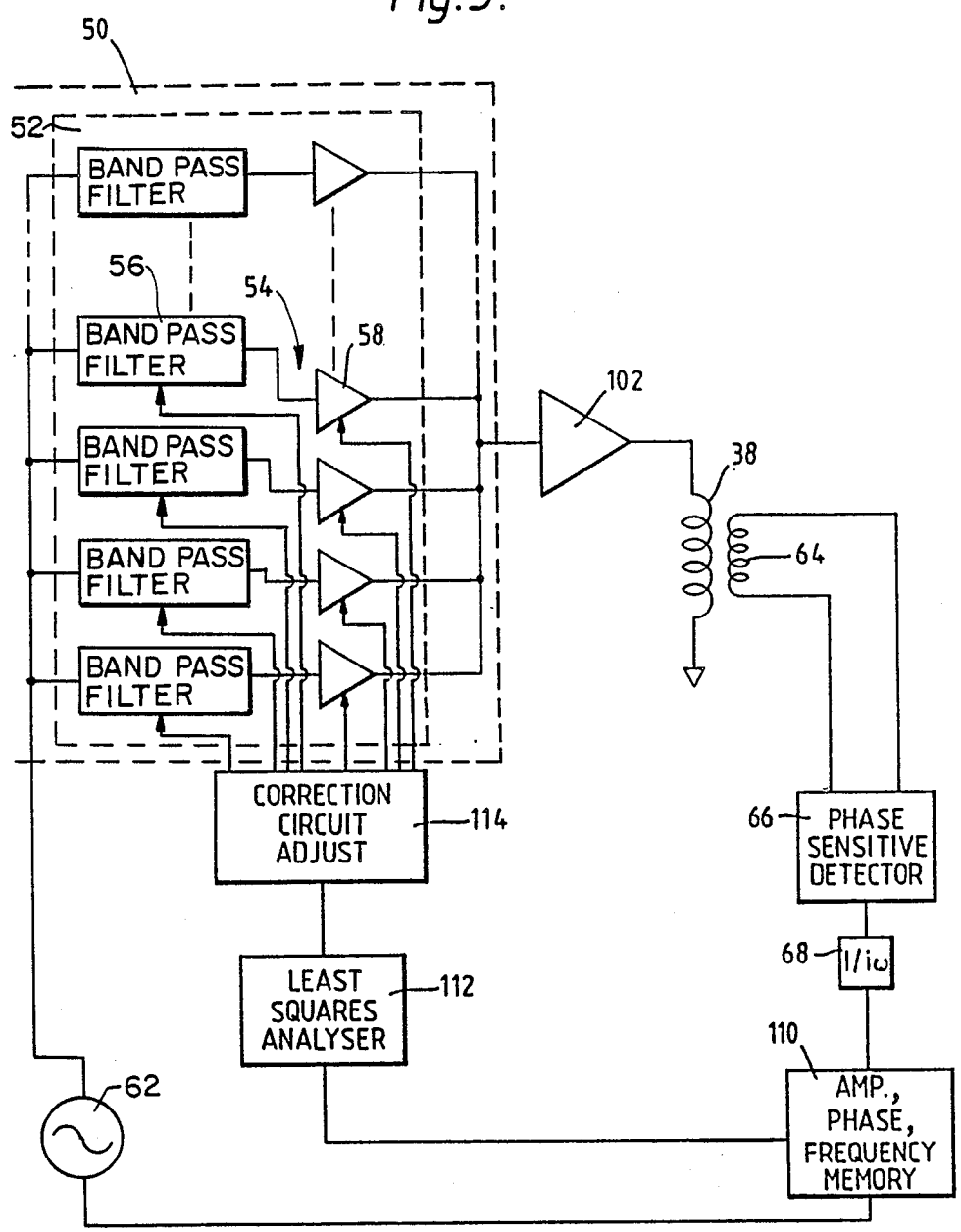
FIG. 5 is an alternate embodiment which facilitates calibration for several eddy current components concurrently.

With reference to FIG. 5, it is to be appreciated that several low frequency eddy currents may be superimposed. In the embodiment of FIG. 5, a plurality of eddy current calibration paths 54 are adjusted concurrently. An oscillating signal source 62 supplies a sinusoidal voltage to the input of the pre-emphasis correction circit 52 which is initially calibrated to provide no pre-emphasis. The output of the pre-emphasis correction circuit is supplied to the input of a current-based power amplifier 102 which drives a sinusoidal current through the gradient coils 38. The current induces a voltage in a small search coil 64 disposed at an appropriate location within gradient coils.

The voltage induced in the search coil is phase sensitively detected to provide an output signal which corresponds to the derivative of the gradient field. The output signal of the phase sensitive detector 66 expresses a complex number indicative of the detected voltage amplitude and relative phase angle. A multiplying means 68 multiplies the complex number output signal by an imaginary number $1/i\omega$, where $\omega$ is the angular frequency of the signal. In effect, this integrates the detected voltage to give a measure of the amplitude of the field generated and its phase relative to that of the drive voltage. These measurements are repeated at a number of frequencies, typically logarithmically spaced between 50 mHz and 200 Hz. The amplitude and phase as detected by the search coil and the amplitude, phase, and frequency of the signal generated by the oscillating signal source 62 are stored in a memory means 110. After a full set of data is collected over the above-referenced frequency range, a least squares fit analysis means 112 performs a least squares fit on the data point to form a complex function of the form:

$$A\left(1 - \sum_{k=1}^{n} \frac{f_k i\omega t_k}{1 + i\omega t_k}\right), \quad (6)$$

where A is a scaling constant, $\omega$ is the angular frequency of the signal, $f_k$ and $t_k$ are fitting parameters. The $f_k$ are amplitude values and the $t_k$ are time constants, and n is the number of correction circuit paths 54, i.e. the number of eddy current components for which correction is made.

A centre frequency or time constant and amplitude adjusting means 114 adjusts the centre frequency or time constant of each of a plurality of band pass filters and the gain of a plurality of corresponding amplifiers. As discussed above, the adjusting means 114 adjusts the frequency and gain values determined in the least square fits in accordance with previously determined experimental relationships between the analytically determined frequency and gain values and the filter frequency parameters and gain of the selected amplifiers. One of the compensation channels is adjusted in accordance with the determined gain $f_1$ and the determined time constant $t_1$. The next corresponding values are used to adjust the next path and so on. Adjusting for parallel paths, as illustrated in FIG. 5, has been found to produce satisfactory results.

After the pre-emphasis correction circuit parallel paths have been adjusted the oscillating current source is stepped through the pre-selected frequencies again, the same measurements are made, and the least squares analysis is performed once more to verify that an accurate correction has been made. If appropriate, a gain and a centre frequency of one or more of the paths may be readjusted. The high frequency, short time constant paths are adjusted utilizing the prior art techniques described above. Preferably, the above-described low frequency long time constant analysis is performed again to make any appropriate adjustments necessitated by the adjustments for the high frequency eddy current components.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiments, the invention in which exclusive right and proprietary interest is claimed is as follows:

1. A method of calibrating an eddy current correction circuit for a gradient coil, which circuit has at least a time constant or center frequency adjustment and a gain adjustment, the method comprising:
   applying an oscillating electrical signal to the gradient coil;
   monitoring at least amplitude and phase of a resultant magnetic field generated by the gradient coil;
   sweeping the applied oscillating signal through a range of frequencies;
   determining a frequency about which at least one of the amplitude and phase of the monitored field changes relative to the applied signal;
   setting a center frequency of the correction circuit in accordance with the determined frequency.

2. The method as set forth in claim 1 further including:
   determining a fractional fall-off of the relative amplitude of the applied signal and monitored field adjacent the determined frequency; and,
   adjusting the correction circuit gain in accordance with the determined fall-off.

3. The method as set forth in claim 1 further including the step of quadrature phase detecting the monitored magnetic field to determine the amplitude and phase thereof.

4. The method as set forth in claim 3 wherein the determining step includes:
   determining a lag between the applied signal and magnetic field phases; and,
   monitoring the phase lag as a function of frequency to determine the frequency at which the phase lag is a maximum.

5. The method as set forth in claim 4 further including:
   determining a ratio of the amplitude of an applied signal and magnetic fields; and,
   determining a fractional fall-off in the amplitude ratio in a frequency range across the determined frequency; and,
   setting the correction circuit gain in accordance with the predetermined fractional fall-off.

6. The method as set forth in claim 5 further including monitoring current flow through the gradient coil and determining the applied signal amplitude and phase therefrom.

7. The method as set forth in claim 1 wherein the determining step includes determining a plurality of frequencies at which the amplitude and phase of the monitored field changes and further including storing each of the frequencies and at least the corresponding determined phases and amplitudes of the monitored changes relative to the applied signal phases and amplitudes.

8. The method as set forth in claim 7 further including:
preforming a least square analysis of the stored phases and amplitudes; and,
adjusting a corresponding plurality of correction circuit centre frequencies and gains in accordance therewith.

9. A method of correcting for eddy currents in an apparatus for applying gradient magnetic field pulses across an examination region, which apparatus includes a gradient field control means for generating current pulses wit a selected profile, an eddy current correction circuit including a plurality of parallel connected correction paths, each path including a band pass filter having an adjustable time constant and an amplifier means having an adjustable gain, the gradient current correction circuit being operatively connected between the gradient field control means and at least one coil for causing magnetic field gradients in the examination region, the correction circuit altering each current pulse profile passing from the gradient field control means to the coil to cause the resultant magnetic field gradient to conform more closely to the unaltered current profile, the method comprising:
applying an oscillating signal of an adjustable frequency through the correction circuit to the coil to create a corresponding oscillating magnetic field in the examination region;
determining changes in the relative amplitude and phase of the applied oscillating signal and the resultant magnetic field as the frequency of the oscillating signal is swept over a preselected frequency range;
adjusting the time constant of at least one of the band pass filters in accordance with the monitored relative phase change; and,
adjusting the gain of at least one of the amplifier means in accordance with the relative amplitude change.

10. In an apparatus for applying gradient magnetic field pulses across an examination region, which apparatus includes a gradient field control means for generating current pulses with a selected profile, an eddy current correction circuit including a plurality of parallel connected correction paths, each path including a band pass filter having an adjustable center frequency and an amplifier means having an adjustable gain, the gradient current correction circuit being operatively connected between the gradient field means and at least one coil for causing magnetic field gradients in the examination region, the improvement comprising:
an oscillator for applying an oscillating signal to the gradient coil;
a search coil which is selectively disposed in the examination region to monitor the resultant magnetic field;
a phase sensitive detector operatively connected with the search coil for producing first signals indicative of the amplitude and phase of the monitored magnetic field relative to the applied oscillating signal;
a maximum phase lag frequency determining means operatively connected to the phase sensitive detector for determining at least one frequency at which the phase of the magnetic field lags the coil current by a local maximum; and,
a time constant adjusting means for adjusting the center frequency of one of the band pass filters in accordance with each local maximum phase lag frequency.

11. The apparatus as set forth in claim 10 further including:
a gain determining means operatively connected to the comparing means for determining a fractional fall-off in amplitude of the magnetic field relative to the applied signal over frequencies adjacent at least one local maximum phase lag frequency; and,
a gain adjusting means for adjusting the gain of one of the amplifier means in accordance with each fractional fall-off.

12. The apparatus as set forth in claim 10 further including:
a current probe for monitoring current flow through the gradient coil;
a second phase sensitive detector operatively connected with the current probe for producing second signals indicative of the amplitude and phase of the current flowing through the gradient coil relative to the applied oscillating signal;
a comparing means for comparing the first and second amplitude and phase signals from the first and second phase sensitive detectors, the comparing means being operatively connected with the maximum phase lag frequency determining means.

13. The apparatus as set forth in claim 12 wherein the comparing means compares the monitored current phase and the monitored magnetic field phase and wherein the maximum phase lag frequency determining means plots the phase lag vs. a log of the frequency and determines the frequency at which the phase lag is a maximum.

14. The apparatus as set forth in claim 12 further including:
a means for determining a relative amplitude shift between the monitored current and magnetic field adjacent the determined phase lag frequency, the relative amplitude change determining means being operatively connected with the comparing means; and,
a gain adjustment means for adjusting the amplifier means gain in accordance with the determined amplitude change.

15. The apparatus as set forth in claim 14 wherein the comparing means divides the first amplitude by the second amplitude and wherein the amplitude change determining means plots the amplitude ratio vs. a log of the frequency.

16. The apparatus as set forth in claim 10 further including:
a main magnetic field means for generating a generally uniform magnetic field through the examination region;
a radio frequency transmitter for applying radio frequency pulses to the examination region;

a sequence control means for causing the radio frequency transmitter and the gradient pulse control means to apply a sequence of radio frequency and magnetic field gradient pulses to the examination region to induce phase and frequency encoded magnetic resonance;

a receiving means for receiving the phase and frequency encoded magnetic resonance signals from the image region; and, a Fourier transform means for Fourier transforming the received magnetic resonance signals into an image representation.

* * * * *